(12) United States Patent
Nakatani et al.

(10) Patent No.: US 7,667,974 B2
(45) Date of Patent: Feb. 23, 2010

(54) MODULE AND MOUNTED STRUCTURE USING THE SAME

(75) Inventors: Seiichi Nakatani, Hirakata (JP); Tsutomu Mitani, Akashi (JP)

(73) Assignee: Panasonic Corporation, Osaka (JP)

( * ) Notice: Subject to any disclaimer, the term of this patent is extended or adjusted under 35 U.S.C. 154(b) by 494 days.

(21) Appl. No.: 10/564,114

(22) PCT Filed: Jan. 20, 2005

(86) PCT No.: PCT/JP2005/000642

§ 371 (c)(1),
(2), (4) Date: Jan. 10, 2006

(87) PCT Pub. No.: WO2005/074029

PCT Pub. Date: Aug. 11, 2005

(65) Prior Publication Data

US 2008/0048307 A1    Feb. 28, 2008

(30) Foreign Application Priority Data

Jan. 28, 2004    (JP) .............................. 2004-019584

(51) Int. Cl.
*H05K 7/02* (2006.01)
*H05K 7/06* (2006.01)
*H05K 7/08* (2006.01)
*H05K 7/10* (2006.01)

(52) U.S. Cl. .................. 361/760; 361/782; 361/784

(58) Field of Classification Search ......... 361/782–785, 361/760–764, 816–818; 257/777–780, 685–686
See application file for complete search history.

(56) References Cited

U.S. PATENT DOCUMENTS

| 5,838,603 | A | 11/1998 | Mori et al. |
| 5,903,239 | A | 5/1999 | Takahashi et al. |
| 6,998,709 | B2 * | 2/2006 | Khorram ............... 257/728 |
| 7,365,683 | B2 * | 4/2008 | Park .................. 343/700 MS |
| 2004/0036074 | A1 | 2/2004 | Kondo |
| 2004/0266382 | A1 | 12/2004 | Lindstedt |

FOREIGN PATENT DOCUMENTS

| CN | 1684258 A | 10/2005 |
| JP | 4-25046 | 1/1992 |
| JP | 8-56113 | 2/1996 |
| JP | 9-326465 | 12/1997 |
| JP | 11-135712 | 5/1999 |
| JP | 2001-326328 | 11/2001 |
| JP | 2003-218315 | 7/2003 |
| JP | 2003-282813 | 10/2003 |
| JP | 2004-22901 | 1/2004 |

* cited by examiner

*Primary Examiner*—Tuan T Dinh
(74) *Attorney, Agent, or Firm*—Hamre, Schumann, Mueller & Larson, P.C.

(57) ABSTRACT

A module that can not only achieve the reduction in size and manufacturing cost but also be impervious to noise due to electromagnetic waves, and a mounted structure using the same are provided. A module (1) includes a substrate (12) and a plurality of semiconductor packages (11a, 11b), each including a semiconductor chip (10), mounted on the substrate (12). Each of the plurality of semiconductor packages (11a, 11b) includes a first radio communication element (16) for transmitting and receiving a signal between the semiconductor chips (10) in the plurality of semiconductor packages (11a, 11b) by radio communication, and the first radio communication element (16) is constituted independently of the semiconductor chip (10).

6 Claims, 7 Drawing Sheets

MODULE AND MOUNTED STRUCTURE USING THE SAME

TECHNICAL FIELD

The present invention relates to a module including a plurality of semiconductor packages and a mounted structure using the same.

BACKGROUND ART

Accompanying the miniaturization and performance enhancement of electronic equipment in recent years, a larger number of pins are included in a semiconductor chip of the electronic equipment, and smaller electronic components of various types constitute the electronic equipment. Accordingly, there has been a dramatic increase in the number and density of wirings in a substrate on which these chips and components are mounted. In particular, the number of terminals in the semiconductor chip and the number of leads led out from the semiconductor chip have increased rapidly, thus narrowing the terminal pitch of the semiconductor chip and the wiring pitch of the substrate on which the semiconductor chip is mounted (a printed board). Consequently, it has become technologically difficult to solder the semiconductor chip. Also, since more layers of finer substrates on which the semiconductor chips are mounted are stacked, an increase in the cost of the substrates has become apparent.

Further, in order to respond to the demand for a higher-density packaging of the electronic components and a higher performance of the substrate on which the electronic components are mounted, research and development actively have been conducted on a system-on-Chip (SOC) technology using a system LSI (Large Scale Integrated Circuit) obtained by providing a single chip of a semiconductor device with a large number of functions and a system-in-package (SIP) technology constituting a single package of one or more semiconductor chips and a plurality of active components and passive components.

For example, Patent document 1 suggests a semiconductor apparatus having a single IC (Integrated Circuit) chip in which a driving element and a control circuit are incorporated.

FIG. 11 is a structural view showing a semiconductor apparatus suggested in Patent document 1. As shown in FIG. 11, a semiconductor apparatus 200 has a substrate 201, and a driving IC chip 202 and a controlling IC chip 203 that are provided separately on the substrate 201.

The driving IC chip 202 includes a transmission-reception antenna 202a, an RF (Radio Frequency) circuit 202b connected to the transmission-reception antenna 202a, a driving element 202c, a control signal detection circuit 202d for detecting a signal for driving the driving element 202c by a signal demodulated by the RF circuit 202b and an anomaly detection circuit 202e for detecting an anomaly when an anomaly occurs in the driving element 202c. On the other hand, the controlling IC chip 203 includes a transmission-reception antenna 203a, an RF circuit 203b connected to the transmission-reception antenna 203a and a control circuit 203c for controlling the driving element 202c incorporated in the driving IC chip 202.

The semiconductor apparatus 200 transmits a signal between the driving IC chip 202 and the controlling IC chip 203 via the transmission-reception antennas 202a and 203a, so that the signal can be transmitted by radio waves between the IC chips. This makes it possible to omit wirings or the like for forming a transmission path of the signal between the IC chips, allowing miniaturization of the entire semiconductor apparatus. Furthermore, the driving element 202c and the control circuit 203c are incorporated into different IC chips, thereby preventing heat generated from the driving element 202c from propagating to the control circuit 203c, so that the performance of the control circuit 203c can be prevented from deteriorating.

Patent document 1: JP 2003-218315A

However, in the semiconductor apparatus 200 suggested in Patent document 1, not only a block responsible for an operation, a storage, etc., which are original functions of a semiconductor, but also a circuit block for signal transmission becomes necessary in each of the IC chips 202 and 203, so that the manufacturing cost increases. Also, since an existing semiconductor chip cannot be used, the versatility is poor.

Moreover, since the RF circuits 202b and 203b respectively are provided in the IC chips 202 and 203, noise due to electromagnetic waves has a greater influence on the driving element 202c and the control circuit 203c. Further, even if the anomaly detection circuit 202e could detect the anomaly attributable to the noise due to electromagnetic waves, the semiconductor apparatus 200 still cannot execute a normal operation while the anomaly lasts.

DISCLOSURE OF INVENTION

The present invention provides a module that not only can achieve the reduction in size and manufacturing cost but also be impervious to noise due to electromagnetic waves, and a mounted structure using the same.

A module according to the present invention includes a substrate, and a plurality of semiconductor packages, each including a semiconductor chip, mounted on the substrate. Each of the plurality of semiconductor packages includes a first radio communication element for transmitting and receiving a signal between the semiconductor chips in the plurality of semiconductor packages by radio communication, and the first radio communication element is constituted independently of the semiconductor chip.

A mounted structure according to the present invention includes the above-described module according to the present invention.

In accordance with the module of the present invention, each of the plurality of semiconductor packages includes a first radio communication element for transmitting and receiving a signal between the semiconductor chips in the plurality of semiconductor packages by radio communication, so that the number of wirings can be reduced. This makes it possible to provide a module that can be miniaturized. Also, since the first radio communication element is constituted independently of the semiconductor chip, existing products can be used for both of the first radio communication element and the semiconductor chip. This can reduce the manufacturing cost of the module. Furthermore, since the first radio communication element is constituted independently of the semiconductor chip, it is possible to reduce the influence of the noise due to electromagnetic waves on the semiconductor chip. Moreover, the mounted structure of the present invention includes the above-described module of the present invention, so that a mounted structure that can not only achieve the reduction in size and manufacturing cost but also be impervious to noise due to electromagnetic waves can be provided similarly to the above.

1B is a schematic view showing one embodiment of a first radio communication element.

Figure 2:
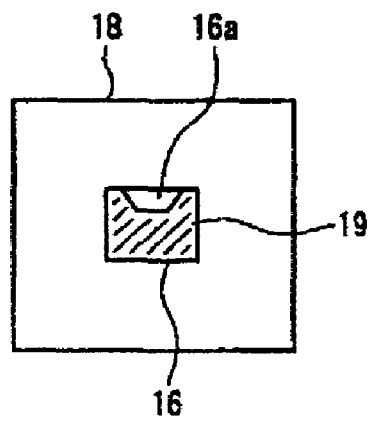

FIG. 2 is a plan view, seen from a substrate side, schematically showing a semiconductor package included in the module according to Embodiment 1 of the present invention.

Figure 3:
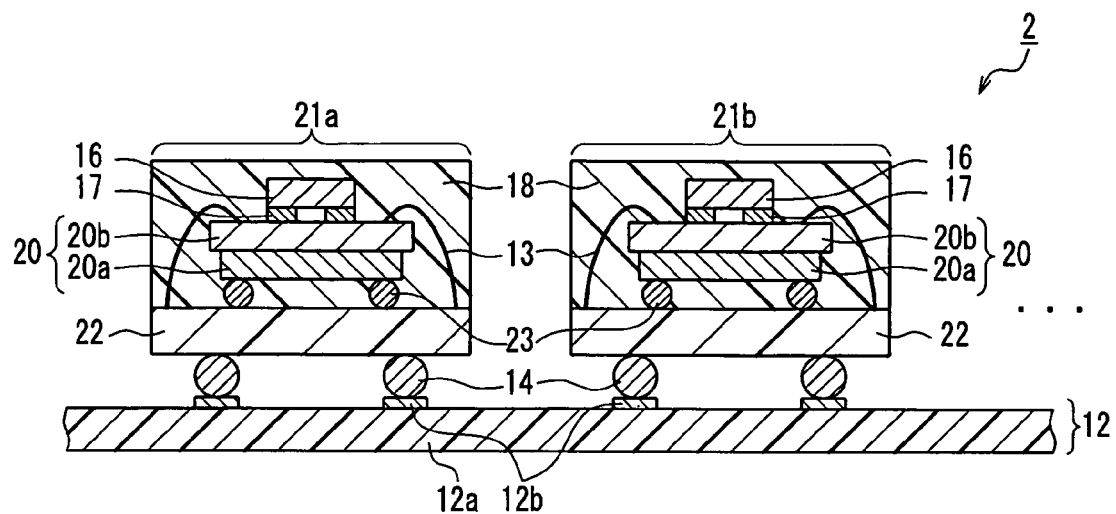

FIG. 3 is a schematic sectional view showing a module according to Embodiment 2 of the present invention.

Figure 4:
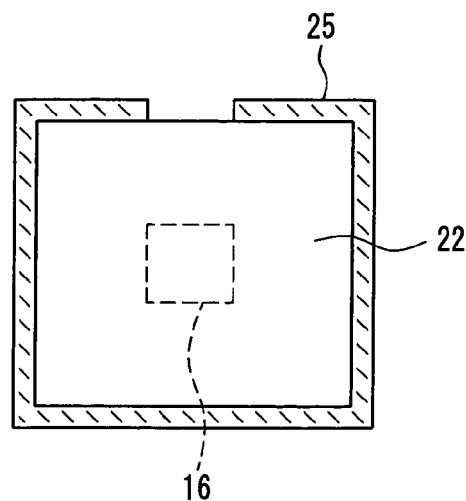

FIG. 4 is a plan view, seen from a substrate side, schematically showing an interposer included in a module according to an embodiment of the present invention.

Figure 5:
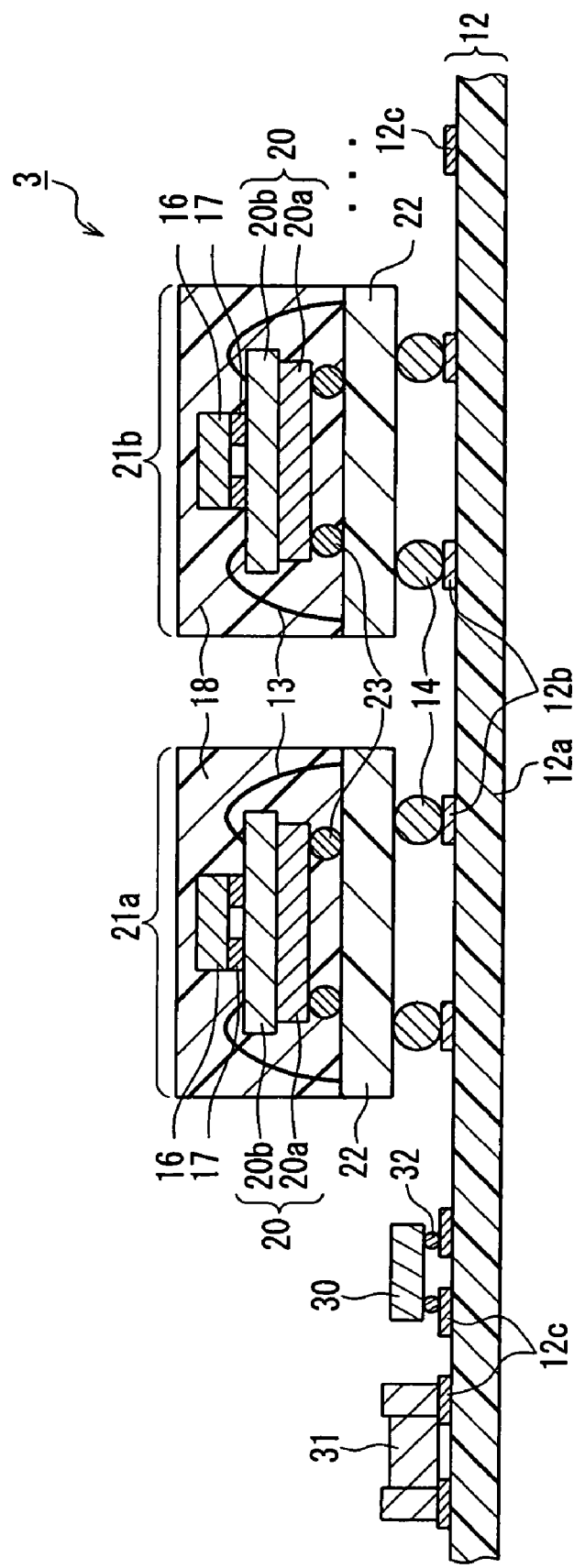

FIG. 5 is a schematic sectional view showing a module according to Embodiment 3 of the present invention.

Figure 6:
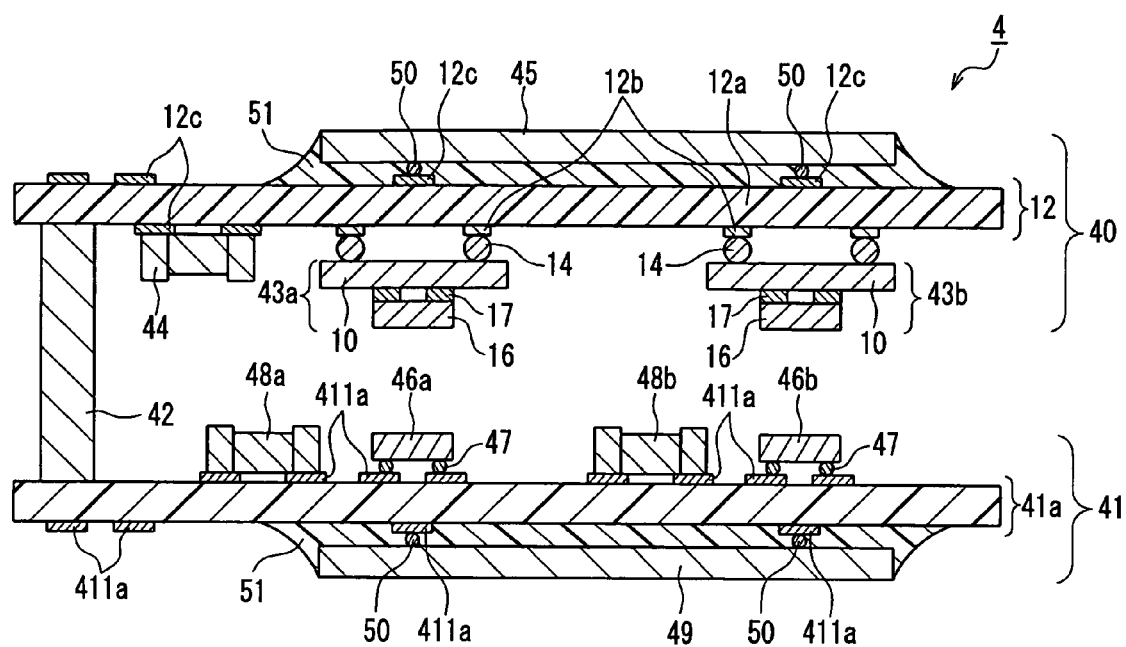

FIG. 6 is a schematic sectional view showing a mounted structure according to Embodiment 4 of the present invention.

Figure 7:
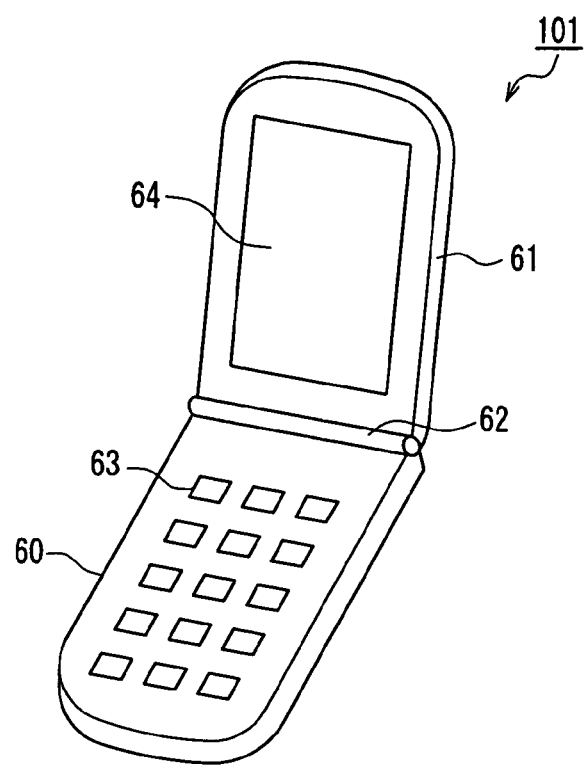

FIG. 7 is a perspective view schematically showing a mobile phone using a plurality of modules according to an embodiment of the present invention.

Figure 8:
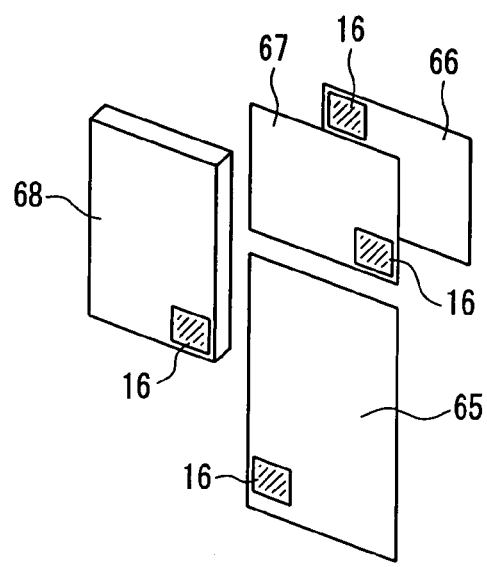

FIG. 8 is a perspective view schematically showing a state in which a plurality of the modules according to an embodiment of the present invention are combined and used in the mobile phone shown in FIG. 7.

Figure 9:
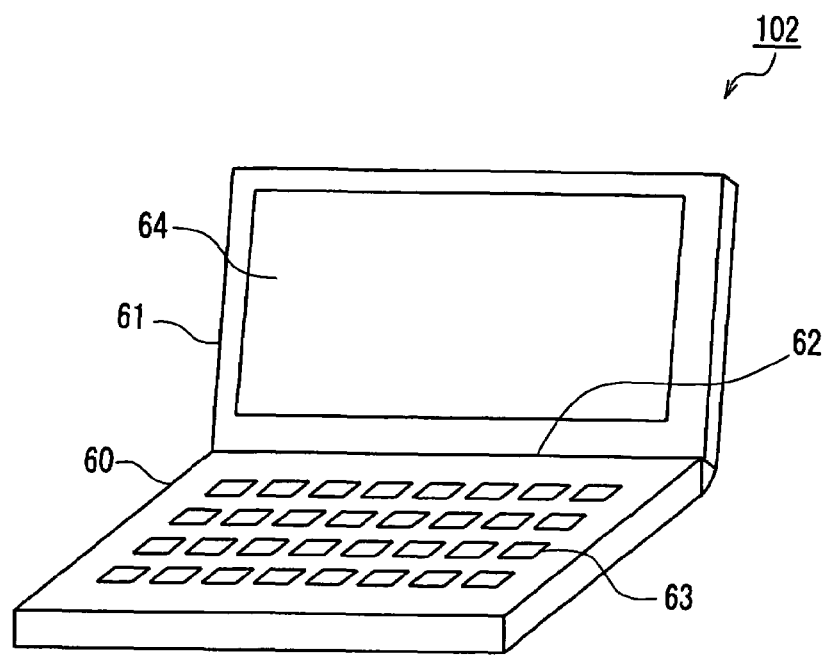

FIG. 9 is a perspective view schematically showing a notebook computer using a plurality of modules according to an embodiment of the present invention.

Figure 10:
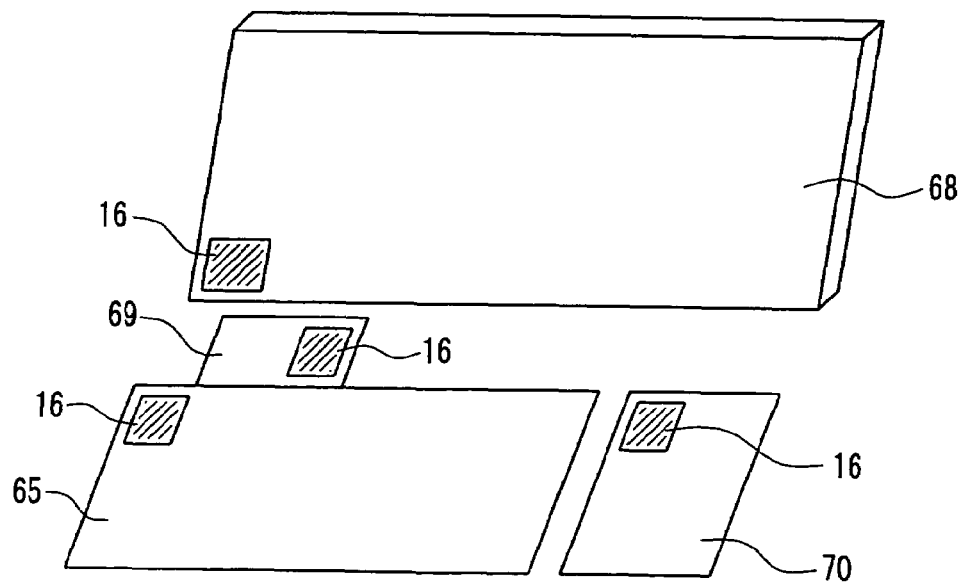

FIG. 10 is a perspective view schematically showing a state in which a plurality of the modules according to an embodiment of the present invention are combined and used in the notebook computer shown in FIG. 9.

Figure 11:
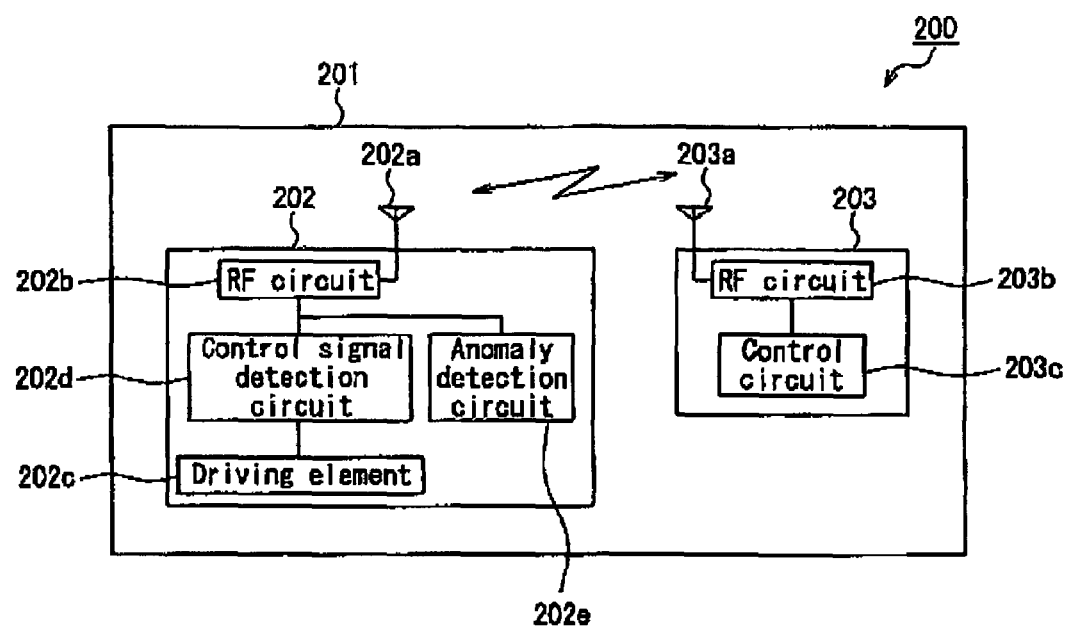

FIG. 11 is a structural view showing a conventional semiconductor apparatus.

DESCRIPTION OF THE INVENTION

A module according to the present invention includes a substrate, and a plurality of semiconductor packages, each including a semiconductor chip, mounted on the substrate.

A base constituting the substrate is not particularly limited but can be, for example, a glass-epoxy base having a thickness of about 100 to 500 μm. The semiconductor chip also is not particularly limited but can be, for example, an existing IC chip, an existing LSI chip or the like. It is appropriate that the number of the semiconductor packages should be at least 2 and set suitably considering the performance, etc. of electronic equipment in which the module is to be used.

Further, in the module according to the present invention, each of the plurality of semiconductor packages includes a first radio communication element for transmitting and receiving a signal between the semiconductor chips in the plurality of semiconductor packages by radio communication. This makes it possible to reduce the number of wirings, so that the miniaturization of the module becomes possible.

The first radio communication element is not particularly limited but can be, for example, an existing RF (Radio Frequency) element or the like. Also, there is no particular limitation on the shape of the first radio communication element, and various shapes such as a flat plate shape, a rod shape and a spherical shape can be used. In order to facilitate the miniaturization of the module, it is preferable that a radio communication element capable of transmitting and receiving electromagnetic waves at an output allowing the electromagnetic waves to reach the other first radio communication element at a distance ranging, for example, from 1 to 20 mm (for example, 1 to 100 mW) is used as the first radio communication element. Further, in the case where an RF element is used as the first radio communication element, it is preferable to use the RF element capable of transmitting and receiving an RF signal at a frequency of 2 to 20 GHz, in order to improve a signal transmission speed.

Additionally, in the module according to the present invention, the first radio communication element is constituted independently of the semiconductor chip. Consequently, existing products can be used for both of the first radio communication element and the semiconductor chip, so that the manufacturing cost of the module can be reduced. Furthermore, it also is possible to reduce the influence of noise due to the electromagnetic waves on the semiconductor chip. Incidentally, to be "constituted independently" means that the first radio communication element and the semiconductor chip are produced individually.

Also, in the case of using existing products for both of the first radio communication element and the semiconductor chip, commonality can be achieved between them as a standard specification, thereby reducing the manufacturing cost.

Further, since the first radio communication element is constituted independently of the semiconductor chip, it is easy to make repairs, which have been difficult in the conventional semiconductor apparatus (see FIG. 11), simply by replacing the first radio communication element or the semiconductor chip individually.

It should be noted that the radio communication conducted by the first radio communication element in the module according to the present invention and a radio communication (for example, a radio LAN, Bluetooth, etc.) conducted in information communication equipment (for example, a notebook computer, a desk-top computer, a mobile phone, etc.) are essentially different. The reason is that such a radio communication conducted in information communication equipment merely receives information from an external part of the equipment or transmits information from an internal part of the equipment and is not a radio communication of transmitting and receiving the signal between the semiconductor chips included in the respective semiconductor packages within the module as in the present invention.

It of course is possible to combine a plurality of the modules according to the present invention so as to achieve a configuration allowing a combination of the radio communication for transmitting and receiving the signal between the semiconductor chips within the module and the radio communication for transmitting and receiving the signal between the semiconductor chips between the different modules. An example thereof will be described later.

The module according the present invention may be a module in which each of the plurality of semiconductor packages further includes a resin portion for sealing the semiconductor chip. This prevents the degradation of the semiconductor chip. Also, in this case, the first radio communication element is provided inside or on a surface of the resin portion. This allows the first radio communication element and the semiconductor chip to be located close to each other, thereby transmitting and receiving the signal between the semiconductor chips more reliably. It is particularly preferable that the first radio communication element is provided inside the resin portion, because the degradation of the first radio communication element can be prevented. Incidentally, a resin material used for the resin portion is not particularly limited but can be, for example, an epoxy resin, a phenolic resin or the like. Additionally, the resin portion has a thickness ranging, for example, from 0.2 to 2 mm.

The module according to the present invention may be a module in which each of the plurality of semiconductor packages further includes a shielding layer for blocking an electromagnetic wave. This makes it possible to reduce the noise due to electromagnetic waves. The shielding layer is not particularly limited as long as it is a layer containing a material blocking electromagnetic waves. For example, it is possible to use a metal layer formed of a metallic material such as copper, aluminum or nickel (a metal foil, a plating layer or the like), a magnetic material layer formed of ferrite or the like or a composite material layer obtained by dispersing metal, a magnetic material or the like in a resin. The shielding layer has a thickness ranging, for example, from about 5 to 50 μm.

The above-noted shielding layer may be provided in a part of a surface of the first radio communication element. This allows electromagnetic waves to be input and output only through a portion without the shielding layer in the first radio communication element, so that necessary electromagnetic waves alone can be transmitted and received.

The module according to the present invention may be a module in which each of the plurality of semiconductor packages further includes an interposer on which the semiconductor chip is placed. With this configuration, the performance of the semiconductor chip can be examined while the semiconductor chip is placed on the interposer, making it possible to judge whether or not the performance of the semiconductor chip is satisfactory before mounting the semiconductor package on the substrate. This improves a yield in a manufacturing process of the module. Also, in this case, the first radio communication element may be provided inside or on a surface of the interposer. This is because not only the performance of the semiconductor chip but also that of the first radio communication element can be examined before mounting the semiconductor package on the substrate. It is particularly preferable that the first radio communication element is provided inside the interposer, because a mounting area on the interposer can be utilized effectively. It should be noted that the interposer can be a rigid substrate such as a glass-epoxy substrate or an aramid-epoxy substrate, a flexible substrate using a polyimide film or the like, or a silicon semiconductor substrate on which a protection circuit, a detection circuit, etc. are formed. Additionally, the interposer has a thickness ranging, for example, from about 100 to 500 μm.

Moreover, the module according to the present invention may be a module in which the substrate on which the semiconductor packages are mounted is a single-sided substrate obtained by forming a conductor pattern on only one principal surface of a base or a double-sided substrate obtained by forming a conductor pattern on both principal surfaces of the base, and each of the plurality of semiconductor packages is mounted on the conductor pattern. This is because it becomes easier to miniaturize the module and reduce the manufacturing cost of the module. In this case, the above-noted conductor pattern may be constituted by at least one terminal selected from the group consisting of a power source terminal and a ground terminal. This is because it becomes even easier to miniaturize the module and reduce the manufacturing cost of the module. Incidentally, a constituent material of the above-noted terminal can be a customary electrically conductive material such as copper or gold.

Further, the module according to the present invention may be a module further including a second radio communication element for transmitting and receiving a signal with respect to at least one of the first radio communication elements included respectively in the plurality of semiconductor packages by radio communication, and an electronic component electrically connected to the second radio communication element. This is because, since the signal can be transmitted and received between the semiconductor chip included in the semiconductor package and the above-noted electronic component by radio communication via the first radio communication element and the second radio communication element, the wirings between the semiconductor chip and the above-noted electronic component can be omitted so as to make it still easier to miniaturize the module. Incidentally, the second radio communication element can be similar to the first radio communication element described above. Also, the above-noted electronic component is not particularly limited but can be, for example, an active component such as a semiconductor chip or a passive component such as a capacitor.

The mounted structure according to the present invention includes the above-described module according to the present invention. Therefore, a mounted structure that not only can achieve the reduction in size and manufacturing cost but also be impervious to noise due to electromagnetic waves can be provided similarly to the above. Hereinafter, embodiments of the present invention will be described in detail.

EMBODIMENT 1

Figure 1A:
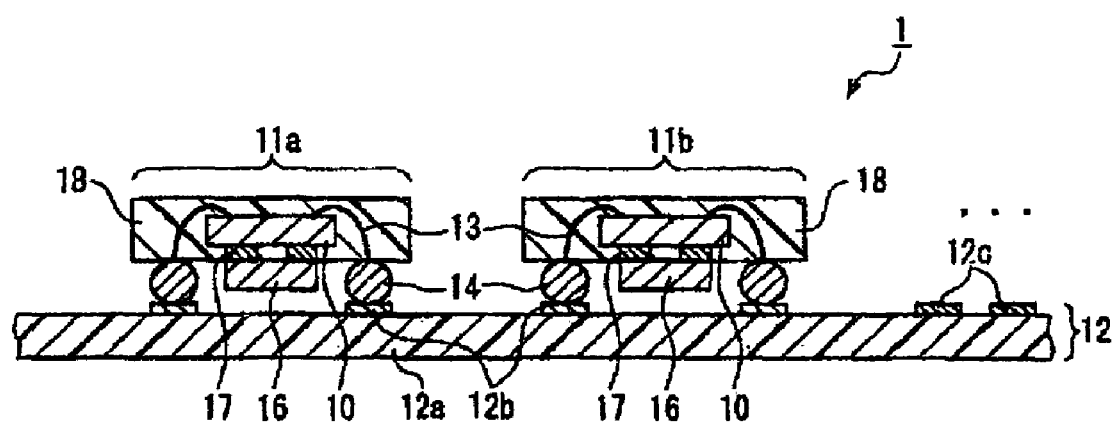
FIG. 1A is a schematic sectional view showing a module according to Embodiment 1 of the present invention and FIG.

First, a module according to Embodiment 1 of the present invention will be described with reference to the accompanying drawings. FIG. 1A to be referred to is a schematic sectional view showing the module according to Embodiment 1. FIG. 2 to be referred to is a plan view, seen from a substrate side, schematically showing a semiconductor package included in the module according to Embodiment 1.

As shown in FIG. 1A, a module 1 according to Embodiment 1 has a substrate 12 and a plurality of semiconductor packages 11a, 11b . . . (in the following, simply referred to as "the semiconductor packages 11a, 11b"), each including a semiconductor chip 10, mounted on the substrate 12.

The semiconductor chip 10 is connected electrically to a terminal 12b formed on one principal surface of a base 12a constituting the substrate 12 via bonding wires 13 and electrically conductive portions 14 formed of solder or the like. It should be noted that the terminal 12b can be at least one terminal selected from the group consisting of a power source terminal and a ground terminal, for example.

Figure 1B:
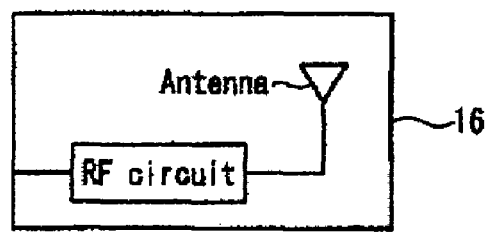

Further, each of the semiconductor packages 11a, 11b includes a first radio communication element 16 for transmitting and receiving a signal between the semiconductor chips 10 in the semiconductor packages 11a, 11b by radio communication (see FIG. 1B). This first radio communication element 16 is connected electrically to the semiconductor chip 10 via electrically conductive portions 17 formed of an electrically conductive material such as copper or solder, in the case of transmitting and receiving the signal between the semiconductor chips 10 included respectively in the semiconductor packages 11a, 11b, the signal is transmitted and received by radio communication between the first radio communication element 16 included in the semiconductor package 11a and the first radio communication element 16 included in the semiconductor package 11b. In other words, the signal is transmitted and received between the semiconductor chips 10 by radio communication via the first radio communication elements 16. Also, the signal is transmitted and received between the semiconductor chips 10 included respectively in the semiconductor packages that are not adjacent to each other in the module 1 (not shown) similarly to the above. This makes it possible to reduce the number of wirings, so that the module 1 can be miniaturized. Incidentally, in order to ensure radio communication, it is preferable that the distance between the first radio communication elements 16 between which the signal is transmitted and received is not greater than 5 mm.

Further, the first radio communication element 16 is constituted independently of the semiconductor chip 10. Consequently, existing products can be used for both of the first radio communication element 16 and the semiconductor chip 10, so that the manufacturing cost of the module 1 can be reduced. Moreover, it also is possible to alleviate the influence of the noise due to electromagnetic waves exerted by radio communication carried out by the first radio communication element 16 on an internal circuit of the semiconductor chip 10.

Also, each of the semiconductor packages 11a, 11b further includes a resin portion 18 for sealing the semiconductor chip 10. This prevents the degradation of the semiconductor chip 10.

Further, since the signal is transmitted and received between the semiconductor chips 10 by radio communication in the module 1, the number of the terminals 12b can be reduced compared with a conventional case. Accordingly, the distance between the terminals 12b can be increased compared with a conventional case, thus making it easier to mount the semiconductor packages 11a, 11b on the substrate 12 (for example, mounting by soldering). This not only improves the yield in the manufacturing stage of the module 1 but also makes it easier to reduce the manufacturing cost.

Moreover, in the module 1, the substrate 12 is a single-sided substrate obtained by forming a conductor pattern formed of the terminals 12b and wirings 12c on only one principal surface of the base 12a, and each of the semiconductor packages 11a, 11b is mounted on the terminals 12b. This eliminates the need to use a thick, heavy and expensive multilayered substrate or the like, making it easier to miniaturize the module 1 and reduce the manufacturing cost of the module 1.

First, a module according to Embodiment 1 of the present invention will be As shown in FIG. 2, a shielding layer 19 (a hatched portion in FIG. 2) for blocking electromagnetic waves is provided in a part of a surface of the first radio communication element 16 facing the substrate 12 (see FIG. 1A). This makes it possible to reduce the noise due to electromagnetic waves and to input and output the electromagnetic waves through only the portion 16a without the shielding layer 19 in the first radio communication element 16, thereby transmitting and receiving only necessary electromagnetic waves.

Further, in accordance with the module 1, the signal can be transmitted and received between the semiconductor chips 10 included respectively in the semiconductor packages 11a, 11b by radio communication, so that the semiconductor packages 11a, 11b can be operated cooperatively.

Now, an example of a detailed configuration of the present embodiment will be described. The outer shape of the semiconductor chip 10 is, for example, a rectangle with sides of 2 to 15 mm and has a thickness of, for example, 0.1 to 0.5 mm. As the semiconductor chip 10, an existing LSI chip or the like can be used, for example. The outer shape of the resin portion 18 is, for example, a rectangle with sides of 3 to 20 mm and has a thickness of, for example, 0.3 to 1.0 mm. The outer shape of the first radio communication element 16 is, for example, a rectangle with sides of 2 to 4 mm and has a thickness of, for example, 0.1 to 0.5 mm. As the first radio communication element 16, an existing RF element or the like can be used, for example. It is preferable that an antenna is connected to the first radio communication element 16.

In a general module, since a signal is transmitted via metal wirings, the transmission clock speed of the signal has been about 200 MHz at maximum. In contrast, in the present embodiment, since a signal is transmitted by radio communication, the transmission clock speed of the signal can be raised to, for example, at least 1000 MHz (e.g., about 1 to 10 GHz).

Although the above description has been directed to the module 1 according to Embodiment 1 of the present invention; the present invention is not limited to the above-described embodiment. For example, a module in which the first radio communication element is provided inside the resin portion may be used. Alternatively, a module may be constituted without using any resin portion.

EMBODIMENT 2

Next, a module according to Embodiment 2 of the present invention will be described with reference to the accompanying drawings. FIG. 3 to be referred to is a sectional view schematically showing the module according to Embodiment 2. Constituent elements that are the same as those in FIG. 1A are assigned the same reference signs, and the description thereof will be omitted.

As shown in FIG. 3, a module 2 according to Embodiment 2 has a substrate 12 and a plurality of semiconductor packages 21a, 21b . . . (in the following, simply referred to as "the semiconductor packages 21a, 21b"), each including a semiconductor chip 20, mounted on the substrate 12. Each of the semiconductor packages 21a, 21b further includes an interposer 22 on which the semiconductor chip 20 is placed.

The semiconductor chip 20 includes a semiconductor chip 20a and a semiconductor chip 20b stacked on the semiconductor chip 20a. The semiconductor chip 20a is mounted on the interposer 22 via electrically conductive portions 23 formed of solder or the like. The semiconductor chip 20b is mounted on the interposer 22 via bonding wires 13. Then, the electrically conductive portions 23 and the bonding wires 13 are connected electrically to each other via a conductor pattern (not shown) provided in the interposer 22. Thus, the semiconductor chip 20a and the semiconductor chip 20b are electrically connected to each other via the electrically conductive portions 23, the conductor pattern provided in the interposer 22 and the bonding wires 13. Further, the conductor pattern provided in the interposer 22 is electrically connected to terminals 12b via a via conductor (not shown) provided in the interposer 22 and electrically conductive portions 14.

Further, each of the semiconductor packages 21a, 21b includes a first radio communication element 16 for transmitting and receiving a signal between the semiconductor chips 20 in the semiconductor packages 21a, 21b by radio communication. This first radio communication element 16 is electrically connected to the semiconductor chip 20b via electrically conductive portions 17. Thus, similarly to the above-described module 1 according to Embodiment 1 (see FIG. 1A), the signal is transmitted and received between the semiconductor chips 20 included respectively in the semiconductor packages 21a, 21b by radio communication, so that wirings etc. can be omitted so as to allow the miniaturization of the module 2.

Further, the first radio communication element 16 is constituted independently of the semiconductor chip 20. Consequently, similarly to the above-described module 1 according to Embodiment 1 (see FIG. 1A), the manufacturing cost of the module 2 can be reduced. Moreover, it also is possible to alleviate the influence of the noise due to electromagnetic waves exerted by radio communication carried Out by the first radio communication element 16 on an internal circuit of the semiconductor chip 20.

Moreover, since each of the semiconductor packages 21a, 21b includes the interposer 22 on which the semiconductor chip 20 is to be placed, the performance of the semiconductor chip 20 can be examined while the semiconductor chip 20 is placed on the interposer 22. Accordingly, it is possible to judge whether or not the performance of the semiconductor chip 20 is satisfactory before mounting the semiconductor packages 21a, 21b on the substrate 12. This improves the yield in a process of manufacturing the module 2.

Also, each of the semiconductor packages 21a, 21b further includes a resin portion 18 for sealing the semiconductor chip 20 and the first radio communication element 16 that are formed on the interposer 22. This prevents the degradation of the semiconductor chip 20 and the first radio communication element 16.

Although the above description has been directed to the module 2 according to Embodiment 2 of the present invention, the present invention is not limited to the above-described embodiment. For example, although the two semiconductor chips are stacked and used as the semiconductor chip in the above-described embodiment, a single semiconductor chip may be used as the semiconductor chip.

Additionally, the first radio communication element 16 may be provided inside or on the surface of the interposer 22. It is particularly preferable that the first radio communication element 16 is provided inside the interposer 22, because the mounting area on the interposer 22 can be utilized effectively. Also, as shown in FIG. 4, which is a plan view schematically showing the interposer 22 seen from the side of the substrate 12, it may be possible to provide the first radio communication element 16 inside the interposer 22 and further to provide a shielding layer 25 (a hatched portion in FIG. 4) for blocking electromagnetic waves in a part of the surface of the interposer 22 (a part of the lateral surface in FIG. 4). This makes it possible to reduce the noise due to electromagnetic waves and to input and output the electromagnetic waves only through the portion without the shielding layer 25 in the interposer 22, thereby transmitting and receiving only desired electromagnetic waves.

EMBODIMENT 3

Next, a module according to Embodiment 3 of the present invention will be described with reference to the accompanying drawings. FIG. 5 to be referred to is a schematic sectional view showing the module according to Embodiment 3. Constituent elements that are the same as those in FIG. 3 are assigned the same reference signs, and the description thereof will be omitted.

As shown in FIG. 5, a module 3 according to Embodiment 3 includes a second radio communication element 30 for transmitting and receiving a signal by radio communication with respect to at least one of first radio communication elements 16 included respectively in semiconductor packages 21a, 21b, and an electronic component 31 that is connected electrically to the second radio communication element 30. The second radio communication element 30 is mounted on wirings 12c of a substrate 12 via electrically conductive portions 32 formed of an electrically conductive material such as copper or solder. The electronic component 31 is connected electrically to the second radio communication element 30 via an electrically conductive member, which is not shown in the figure, and mounted on the wirings 12c of the substrate 12. Others are similar to those in the above-described module 2 according to Embodiment 2 (see FIG. 3). Therefore, the module 3 according to Embodiment 3 also can produce an effect similar to that of the module 2 according to Embodiment 2.

In addition, with the configuration described above, the module 3 can transmit and receive the signal between at least one of the semiconductor chips 20 included in the semiconductor packages 21a, 21b and the electronic component 31 via the first radio communication element 16 and the second radio communication element 30 by radio communication. This makes it possible to omit the wirings between the semiconductor chip 20 and the electronic component 31, so that the miniaturization of the module 3 becomes even easier.

EMBODIMENT 4

Now, a mounted structure according to Embodiment 4 of the present invention will be described with reference to the accompanying drawings. FIG. 6 to be referred to is a schematic sectional view showing the mounted structure according to Embodiment 4. Constituent elements that are the same as those in FIG. 1A are assigned the same reference signs, and the description thereof will be omitted.

As shown in FIG. 6, a mounted structure 4 according to Embodiment 4 includes a module 40 according to an embodiment of the present invention, a circuit board 41, and a power source connecter 42 for electrically connecting the module 40 and the circuit board 41.

The module 40 has a substrate 12 and semiconductor packages 43a, 43b, each including a semiconductor chip 10, mounted on the substrate 12. Also, the module 40 further includes electronic components 44 and 45 mounted on wirings 12c of the substrate 12. Among them, the electronic component 45 is mounted on the wirings 12c via electrically conductive portions 50 formed of an electrically conductive material such as copper or solder, and a sealing resin 51 formed of an epoxy resin or the like is filled between this electronic component 45 and a base 12a.

Each of the semiconductor packages 43a, 43b includes a first radio communication element 16 for transmitting and receiving a signal between the semiconductor chips 10 in the semiconductor packages 43a, 43b by radio communication. This first radio communication element 16 is connected electrically to the semiconductor chip 10 via electrically conductive portions 17. The semiconductor chip 10 is connected electrically to terminals 12b via electrically conductive portions 14.

The circuit board 41 includes a substrate 41a, a third radio communication element 46a for transmitting and receiving a signal by radio communication with respect to the first radio communication element 16 included in the semiconductor package 43a, and a third radio communication element 46b for transmitting and receiving a signal by radio communication with respect to the first radio communication element 16 included in the semiconductor package 43b. The third radio communication elements 46a and 46b are disposed so as to face the first radio communication elements 16 and 16 included in the semiconductor packages 43a and 43b, respectively, and mounted on wirings 411a of the substrate 41a via electrically conductive portions 47 formed of an electrically conductive material such as copper or solder.

Moreover, the circuit board 41 further includes electronic components 48a, 48b and 49 mounted on the wirings 411a of the substrate 41a. Among them, the electronic components 48a and 48b are connected electrically to the third radio communication elements 46a and 46b, respectively, via electrically conductive members, which are not shown in the figure. Also, similarly to the electronic component 45 described above, the electronic component 49 is mounted on the wirings 411a via electrically conductive portions 50, and the sealing resin 51 is filled between this electronic component 49 and the substrate 41a.

The mounted structure 4 constituted as above can transmit and receive the signal between the semiconductor chips 10 respectively included in the semiconductor packages 43a and 43b by radio communication, similarly to Embodiments 1 to 3 described above. Further, the signal can be transmitted and received between the semiconductor chip 10 included in the semiconductor package 43a and the electronic component 48a via the first radio communication element 16 and the third radio communication element 46a by radio communication. Moreover, the signal can be transmitted and received between the semiconductor chip 10 included in the semiconductor package 43b and the electronic component 48b via the first radio communication element 16 and the third radio communication element 46b by radio communication. In this manner, the number of the wirings can be reduced, thus making it possible to miniaturize the mounted structure 4.

Further, as described above, the signal can be transmitted and received between the semiconductor chips 10 respectively included in the semiconductor packages 43a and 43b and the electronic component 48a or 48b by radio communication. Consequently, as shown in FIG. 6, the module 40 and the circuit board 41 can be connected electrically to each other by the power source connector 42 alone. In other words, it is possible to omit connections for signal transmission (wirings, via conductors, etc.) between the module 40 and the circuit board 41.

Also, since the mounted structure 4 includes the module 40 according to an embodiment of the present invention, it is possible to provide a mounted structure that can reduce the manufacturing cost and is impervious to the noise due to electromagnetic waves similarly to the above. Incidentally, the electronic components 44, 45, 48a, 48b and 49 are not particularly limited but can be, for example, an active component such as a semiconductor chip or a passive component such as a capacitor.

Although the above description has been directed to the mounted structure 4 according to Embodiment 4 of the present invention, the present invention is not limited to the above-described embodiment. For example, a mounted structure further including a resin portion for sealing the semiconductor chip may be provided. Also, a mounted structure including a plurality of the modules according to an embodiment of the present invention may be provided.

EMBODIMENT 5

Now, as Embodiment 5 of the present invention, the following description is directed to an example of using a combination of a plurality of the modules according to an embodiment of the present invention in a mobile phone. FIG. 7 to be referred to is a perspective view schematically showing a mobile phone in which a plurality of the modules according to an embodiment of the present invention are used. Further, FIG. 8 to be referred to is a perspective view schematically showing the state in which a plurality of the modules according to an embodiment of the present invention are combined and used in the mobile phone shown in FIG. 7, it should be noted that constituent elements other than a first radio communication element in each module are omitted in FIG. 8. Also, constituent elements that are the same as those in FIG. 1A are assigned the same reference signs, and the description thereof will be omitted.

As shown in FIG. 7, a mobile phone 101 includes a first body portion 60, a second body portion 61, a hinge portion 62 located between the first body portion 60 and the second body portion 61, a key pad (an input means) 63 provided in the first body portion 60 and a liquid crystal unit (a display means) 64 provided in the second body portion 61.

Inside the first body portion 60, as shown in FIG. 8, a module 65 for controlling the key pad 63, a module 66 for controlling an external communication portion (not shown) and a module 67 serving as a logic module are provided. Also, inside the second body portion 61, a module 68 for controlling the liquid crystal unit 64 is provided. The modules 65, 66, 67 and 68 are obtained by forming the module according to any one of Embodiments 1 to 3 described above into a sheet. Incidentally, in FIG. 8, one of a plurality of the first radio communication elements 16 included in each of the modules 65, 66, 67 and 68 is shown alone for facilitating understanding.

Since the modules 65, 66, 67 and 68 are all modules according to any one of Embodiments 1 to 3 described above, the signal is transmitted and received between the semiconductor chips (not shown) within the modules by radio communication using the first radio communication element 16 as described above. Thus, the wirings etc. in the modules 65, 66, 67 and 68 can be omitted, thereby allowing the miniaturization of the mobile phone 101.

Further, by providing a configuration in which the signal is transmitted and received between the semiconductor chips in the individual modules 65, 66, 67 and 68 (for example, between those in the module 65 and the module 68, etc.) also by radio communication, the wirings etc. between the modules can be omitted, thus making it easier to miniaturize the mobile phone 101. As such a configuration, for example, it may be possible to provide the first radio communication element 16 with a function of transmitting and receiving the signal between the semiconductor chips within the module by radio communication and a function of transmitting and receiving the signal between the semiconductor chips in the different modules by radio communication. Alternatively, a radio communication element for transmitting and receiving the signal between the semiconductor chips in the different modules by radio communication may be provided in addition to the first radio communication element 16 in each of the modules. Incidentally, as the radio communication element for transmitting and receiving the signal between the semiconductor chips in the different modules by radio communication, a radio communication element capable of transmitting and receiving electromagnetic waves at an output of, for example, about 1 to 100 mW, is preferable for ensuring the radio communication.

In a conventional folding mobile phone, since a hinge portion is present between a liquid crystal unit and a key pad, for example, there have been various constraints on the physical connection between the liquid crystal unit and the key pad with wirings. Therefore, the degree of freedom in design has been restricted. In contrast, by transmitting and receiving the signal between the semiconductor chips in the different modules using radio communication as described above, it is possible to provide a folding mobile phone having a high degree of freedom in design.

EMBODIMENT 6

Now, as Embodiment 6 of the present invention, the following description is directed to an example of using a combination of a plurality of the modules according to an embodiment of the present invention in a notebook computer. FIG. 9 to be referred to is a perspective view schematically showing a notebook computer in which a plurality of the modules according to an embodiment of the present invention are used. Further, FIG. 10 to be referred to is a perspective view schematically showing the state in which a plurality of the modcombined and used in the notebook computer shown in FIG. 9. It should be noted that constituent elements other than a first radio communication element in each module are omitted in FIG. 10. Also, constituent elements that are the same as those in FIGS. 7 and 8 are assigned the same reference signs, and the description thereof will be omitted.

As shown in FIG. 9, a notebook computer 102 includes a first body portion 60, a second body portion 61, a hinge portion 62 located between the first body portion 60 and the second body portion 61, a key pad 63 provided in the first body portion 60 and a liquid crystal unit 64 provided in the second body portion 61.

Inside the first body portion 60, as shown in FIG. 10, a module 65 for controlling the key pad 63, a module 69 serving as a storage module and a module 70 for controlling a power source portion (not shown) are provided. Also, inside the second body portion 61, a module 68 for controlling the liquid crystal unit 64 is provided. The modules 65, 68, 69 and 70 are obtained by forming the module according to any one of Embodiments 1 to 3 described above into a sheet. Incidentally, in FIG. 10, one of a plurality of the first radio communication elements 16 included in each of the modules 65, 68, 69 and 70 is shown alone for facilitating understanding.

Since the modules 65, 68, 69 and 70 are all modules according to any one of Embodiments 1 to 3 described above, the signal is transmitted and received between the semiconductor chips (not shown) within the modules by radio communication using the first radio communication element 16 as described above. Thus, the wirings etc. in the modules 65, 68, 69 and 70 can be omitted, thereby allowing the miniaturization of the notebook computer 102.

Further, by providing a configuration in which the signal is transmitted and received between the semiconductor chips in the individual modules 65, 68, 69 and 70 (for example, between those in the module 65 and the module 68, etc.) also by radio communication, the wirings etc. between the modules can be omitted, thus making it easier to miniaturize the notebook computer 102. As such a configuration, similarly to Embodiment 5 described above, it may be possible to provide the first radio communication element 16 with a function of transmitting and receiving the signal between the semiconductor chips within the module by radio communication and a function of transmitting and receiving the signal between the semiconductor chips in the different modules by radio communication. Alternatively, a radio communication element for transmitting and receiving the signal between the semiconductor chips in the different modules by radio communication may be provided in addition to the first radio communication element 16 in each of the modules.

It should be noted that, in the examples illustrated by FIGS. 7 and 9, the liquid crystal unit 64 serving as the display means may be other display devices such as an organic EL (Electroluminescence) unit, for example.

INDUSTRIAL APPLICABILITY

The module and the mounted structure of the present invention are useful for electronic equipment requiring the miniaturization and performance enhancement, for example, a mobile phone or a notebook computer.

The invention claimed is:

1. A module comprising:
a substrate; and
a plurality of semiconductor packages, each comprising a semiconductor chip, mounted on the substrate;
wherein each of the plurality of semiconductor packages comprises a first radio communication element that is constituted independently of the semiconductor chip so as to transmit and receive a signal between the semiconductor chips in the plurality of semiconductor packages by radio communication,
the first radio communication element comprises an antenna and an RF circuit, and
a surface of the first radio communication element in each of the plurality of semiconductor packages includes a first portion provided with a shielding layer and a second portion provided with no shielding layer, and an electromagnetic wave is input and output only through the second portion to transmit and receive a signal.

2. The module according to claim 1, wherein each of the plurality of semiconductor packages further comprises a resin portion for sealing the semiconductor chip.

3. The module according to claim 1, wherein each of the plurality of semiconductor packages further comprises a resin portion for sealing the semiconductor chip, and
the first radio communication element is provided inside or on a surface of the resin portion.

4. The module according to claim 1, wherein shielding layer is provided for blocking an electromagnetic wave.

5. The module according to claim 1, wherein the substrate is a single-sided substrate obtained by forming a conductor pattern on only one principal surface of a base or a double-sided substrate obtained by forming a conductor pattern on both principal surfaces of the base, and
each of the plurality of semiconductor packages is mounted on the conductor pattern.

6. The module according to claim 5, wherein the conductor pattern is constituted by at least one terminal selected from the group consisting of a power source terminal and a ground terminal.

* * * * *